(12) United States Patent
Kim et al.

(10) Patent No.: US 12,154,614 B2
(45) Date of Patent: Nov. 26, 2024

(54) SEMICONDUCTOR DEVICE HAVING A NON-VOLTAILE MEMORY WITH HIGH SPEED-READ OPERATION

(71) Applicant: SK keyfoundry Inc., Cheongju-si (KR)

(72) Inventors: Yonghwan Kim, Cheongju-si (KR); Youngchul Seo, Gwangmyeong-si (KR); Weon-Hwa Jeong, Seoul (KR); Chulgeun Lim, Gunsan-si (KR); Sungbum Park, Seongnam-si (KR); Keesik Ahn, Hwaseong-si (KR)

(73) Assignee: SK keyfoundry Inc., Cheongju-si (KR)

( * ) Notice: Subject to any disclaimer, the term of this patent is extended or adjusted under 35 U.S.C. 154(b) by 191 days.

(21) Appl. No.: 17/696,947

(22) Filed: Mar. 17, 2022

(65) Prior Publication Data

US 2023/0117141 A1  Apr. 20, 2023

(30) Foreign Application Priority Data

Oct. 20, 2021 (KR) .......................... 10-2021-0139948

(51) Int. Cl.
*G11C 16/04* (2006.01)
*G11C 11/4074* (2006.01)
(Continued)

(52) U.S. Cl.
CPC ...... *G11C 11/4091* (2013.01); *G11C 11/4074* (2013.01); *G11C 11/4087* (2013.01); *G11C 11/4094* (2013.01)

(58) Field of Classification Search
CPC .......... G11C 11/4091; G11C 11/4074; G11C 11/4087; G11C 11/4094; G11C 16/24; G11C 16/32; G11C 16/26; G11C 7/06
(Continued)

(56) References Cited

U.S. PATENT DOCUMENTS 3,932,848 A * 1/1976 Porat .................. G11C 11/4091
365/189.11
7,336,544 B2   2/2008 Takemura
(Continued)

FOREIGN PATENT DOCUMENTS

KR    10-2014-0141113 A    12/2014

OTHER PUBLICATIONS

Korean Office Action issued on Jun. 28, 2023, in counterpart Korean Patent Application No. 10-2021-0139948 (4 pages in Korean).

*Primary Examiner* — Tha-O H Bui
(74) *Attorney, Agent, or Firm* — NSIP Law

(57) ABSTRACT

A semiconductor device includes a memory cell array including a plurality of memory cells, a bit line selection circuit, including a first main select transistor, and a plurality of first sub-select transistors connected in parallel with each other, and the plurality of first sub-select transistors configured to be the first memory cell through the first bit line to transfer the read current from the first bit line to the first memory cell; and a sense amplifier configured to compare a reference current having a predetermined current value with a memory current drawn by the first memory cell, and output an output signal based on an input voltage, the sense amplifier including an active load, connected to the first main select transistor, comprising a PMOS diode or a NMOS diode configured to lower the input voltage at a sense node.

14 Claims, 8 Drawing Sheets

(51) Int. Cl.
  *G11C 11/408*   (2006.01)
  *G11C 11/4091*  (2006.01)
  *G11C 11/4094*  (2006.01)

(58) Field of Classification Search
  USPC .................................................. 365/185.21
  See application file for complete search history.

(56) References Cited

U.S. PATENT DOCUMENTS

| | | |
|---|---|---|
| 7,808,817 B2 | 10/2010 | Cho et al. |
| 10,255,956 B2 | 4/2019 | Iwase et al. |
| 10,636,491 B2 | 4/2020 | Shin et al. |
| 10,854,292 B2 * | 12/2020 | Shin ........................ G11C 7/04 |
| 11,282,573 B2 * | 3/2022 | Manfre' ............... G11C 13/004 |
| 2014/0355354 A1 | 12/2014 | Ahn |
| 2020/0411090 A1 * | 12/2020 | Manfre' ................... G11C 8/10 |

\* cited by examiner

SEMICONDUCTOR DEVICE HAVING A NON-VOLTAILE MEMORY WITH HIGH SPEED-READ OPERATION

CROSS-REFERENCE TO RELATED APPLICATION

This application claims the benefit under 35 U.S.C. § 119 of Korean Patent Application No. 10-2021-0139948, filed on Oct. 20, 2021, in the Korean Intellectual Property Office, the entire disclosure of which is incorporated herein by reference for all purposes.

BACKGROUND

1. Field

The following description relates to a semiconductor device having a non-volatile memory with a high speed-read operation.

2. Description of Related Art

A non-volatile memory such as flash memory, a type of embedded memory, is being widely used. For such a non-volatile memory, a storage device that provides the amount of current, which varies according to the stored data value, may be used. Accordingly, in order to read the data from the storage device, the value of the data stored in the storage device can be determined by determining the magnitude of the current output from the storage device when the data is read.

An embedded memory refers to a memory integrated with a logic core in a chip. The use of embedded memory reduces the use of external memory chips. As a result, the space size can be reduced, data can be stored or read faster than the case of using the external memory, and power consumption can also be reduced.

Here, to maximize the efficiency of the embedded memory, it is desired to read the data stored in the storage device as fast as possible. The purpose of various embodiments of the present disclosure is to provide a semiconductor device with an increased reading speed compared to conventional methods in a semiconductor device that reads data values stored in a storage device of an embedded memory.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a memory cell array including a plurality of memory cells; bit lines connected to the memory cells; a bit line selection circuit, including a first main select transistor, and a plurality of first sub-select transistors connected in parallel with each other, each gate of the first sub-transistors configured to receive a separated gate control signal, and the plurality of first sub-select transistors configured to be the first memory cell through the first bit line to transfer the read current from the first bit line to the first memory cell; and a sense amplifier configured to compare a reference current having a predetermined current value with a memory current drawn by the first memory cell, and output an output signal based on an input voltage, the sense amplifier including an active load, connected to the first main select transistor, including a PMOS diode or a NMOS diode configured to lower the input voltage at a sense node. When a first memory cell of the memory cells and a first bit line of the bit lines are selected, a read current is supplied to the first memory cell through the first bit line to perform reading operation.

The plurality of first sub-transistors may be disposed between the first main select transistor and the bit line.

The bit line selection circuit may further include a plurality of second sub-select transistors connected to the first main select transistor. The plurality of second sub-select transistors may be connected to a second bit line, and the second bit line may be connected to a second memory cell.

The sense amplifier may further include a current source circuit configured to generate the reference current, a current mirror circuit configured to mirror the reference current and supply the reference current to the active load, a bit line regulator circuit, configured to maintain the read current, connected to the bit line selection circuit, and a sense amplifier output circuit connected to the sense node and configured to generate the output signal.

The current mirror circuit may include a first PMOS transistor, and a second PMOS transistor. Sources of the first and second PMOS transistors may be connected to an operating power supply, and gates of the first and second PMOS transistors may be connected to a constant current power supply and a drain of the first PMOS transistor.

The bit line regulator circuit may include a first NMOS transistor, a third PMOS transistor, and a fifth NMOS transistor. Gates of the third PMOS and fifth NMOS transistors may be connected to the bit line, and drains of the third PMOS and fifth NMOS transistors may be connected to a gate of the first NMOS transistor.

The sense amplifier output circuit may include a fifth PMOS transistor, a sixth PMOS transistor, a sixth NMOS transistor, a seventh NMOS transistor, and an inverter. Sources of the fifth and sixth PMOS transistors may be connected to an operating power supply. Drains of the fifth and sixth PMOS transistors may be connected to gates of the sixth and seventh NMOS transistors, respectively.

An embedded flash memory may include the semiconductor device.

In another general aspect, a semiconductor device may include a current source circuit configured to generate a reference current, a current mirror circuit configured to mirror the reference current and supply the reference current to an active load, a bit line selection circuit, configured to select a bit line connected to a memory cell to be read, includes a plurality of bit line select transistors connected to the selected bit line, the plurality of bit line select transistors supplying a read current to the selected bit line, and gate electrodes of the plurality of bit line select transistors configured to receive gate control signals, respectively, and a sense amplifier output circuit configured to determine whether a value stored in the memory cell is "L (low)" or "H (high)."

The semiconductor device may further include a bit line regulator circuit configured to maintain a bit line voltage of the selected bit line and connect the selected bit line to the active load.

When a current provided by the memory cell is greater than the reference current, an output signal of the sense amplifier output circuit may become "L (low)", and when the current provided by the memory cell is less than the reference current, the output signal may become "H (high)".

An embedded flash memory may includes the semiconductor device.

In another general aspect, an embedded flash memory, includes a memory cell array, a bit line selection circuit, and a sense amplifier. The memory cell array includes memory cells connected to bit lines configured to supply read current to the memory cells during reading operations. T bit line selection circuit, includes main select transistors, and sub-select transistors, each of the main select transistors connected to subsets of the sub-select transistors, each of the subsets of the sub-select transistors connected to each other in parallel, gates of the subsets of the sub-transistors configured to receive gate control signals, respectively. The sense amplifier is configured to compare a reference current with memory currents drawn by the memory cells, and output output signals based on an input voltage, the sense amplifier includes active loads connected to the main select transistors, respectively, each of the active loads includes a metal-oxide semiconductor (MOS) diode configured to lower the input voltage at a sense node of corresponding ones of the active loads. The bit line selection circuit is disposed between the bit lines and the active loads.

When a memory current of the memory currents is more than the reference current, the input voltage at the sense node of the corresponding ones of the active loads decreases.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
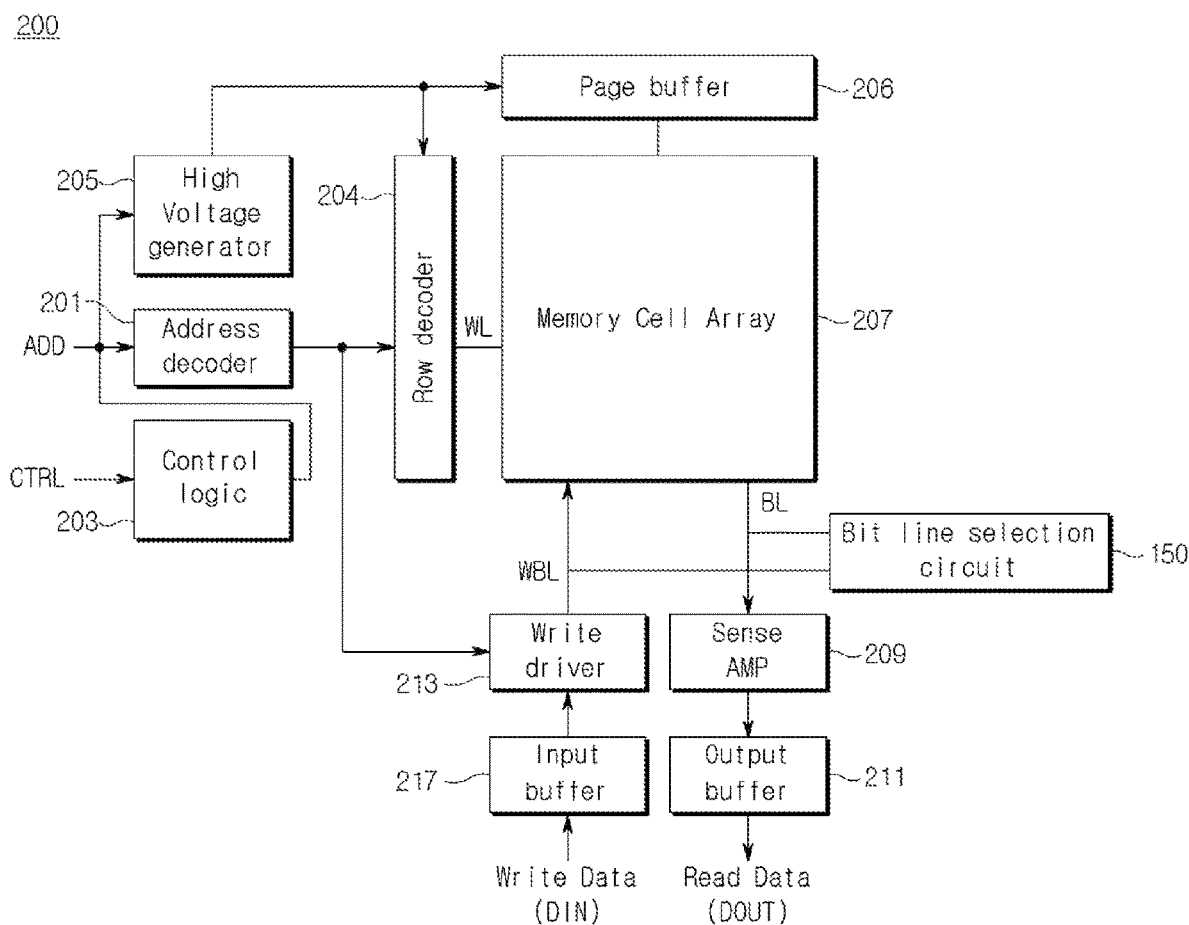
FIG. 1 illustrates a block diagram of an embedded flash memory according to one or more embodiments of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," etc. may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include varies in shape that occur during manufacturing.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

The features of the examples described herein may be combined in various ways, as will be apparent after an understanding of the disclosure of this application. Further, although the examples described herein have a variety of configurations, other configurations are possible, as will be apparent after an understanding of the disclosure of this application.

This disclosure may solve the above problems using a semiconductor device, including poly-silicon junction field-effect transistor that may embody various withstand voltages through a junction structure equipped with a poly-silicon formed on a substrate, and providing a manufacturing method thereof.

A targeted problem of the disclosure is not limited by the problems which are mentioned above, and other problems may be understood by a person skilled in the relevant field of technology, from the following description.

A detailed description of the disclosure is given below, with attached drawings.

The present disclosure proposes a semiconductor device that enables a fast read operation even in the above-described situation.

FIG. 1 illustrates a block diagram of an embedded flash memory according to one or more embodiments of the present disclosure.

Referring to FIG. 1, an embedded flash memory (eFlash memory, or eFlash IP) 200 comprises: a control logic 203 configured to receive an external signal CTRL and output a program operation signal, an erasure operation signal, or the like; an address decoder 201; a row decoder 204 configured to select a word line WL of a memory cell array; a column decoder (not shown) configured to select a bit line of the memory cell array; a high voltage generator 205 configured to generate a read voltage and a write voltage; a page buffer 206 which receives the read voltage and the write voltage and stores data to be programmed; a memory cell array (eFlash Cell Array) 207 which comprises a plurality of memory cells; a sense amplifier 209 for the read operation; an output buffer 211 which stores read data DOUT obtained by the read operation; a write driver 213 for the write operation; an input buffer 217 which stores write data DIN for write operation.

According to one or more embodiments, the address decoder 201 may output signals to program or erase the memory cells through the row/column decoders. The plurality of memory cells may be connected to the plurality of word lines WL and the plurality of bit lines BL. Selected memory cell may be programmed or erased based on the write operation. The sense amplifier 209 can detect and amplify a potential difference between a reference voltage and a bit line voltage from the memory cell by performing a read operation. Thus, the sense amplifier 209 may produce output signal, whether the selected memory cell is programmed or erased, by comparing the reference voltage and the bit line voltage read. The sense amplifier 209 may provide read data or output signal to the output buffer 211. According to one or more embodiments, the write driver 213 may provide the write data DIN provided from the input buffer 217 to the memory cell array 207 for write operation. Herein, the write operation may comprise a program operation or an erase operation.

The embedded flash memory (eFlash memory, or eFlash IP) 200 may further comprise a bit line selection circuit 150. The bit line selection circuit 150 may select a bit line in the program/erase operation or the read operation. In the program operation, a program current may flow to a bit line selected by the bit line selection circuit 150. The selected bit line may be connected to a write bit line WBL in the program operation. In the read operation, a read current may flow to a bit line selected by the bit line selection circuit 150. The selected bit line may be connected to a read bit line in the read operation.

Figure 2:
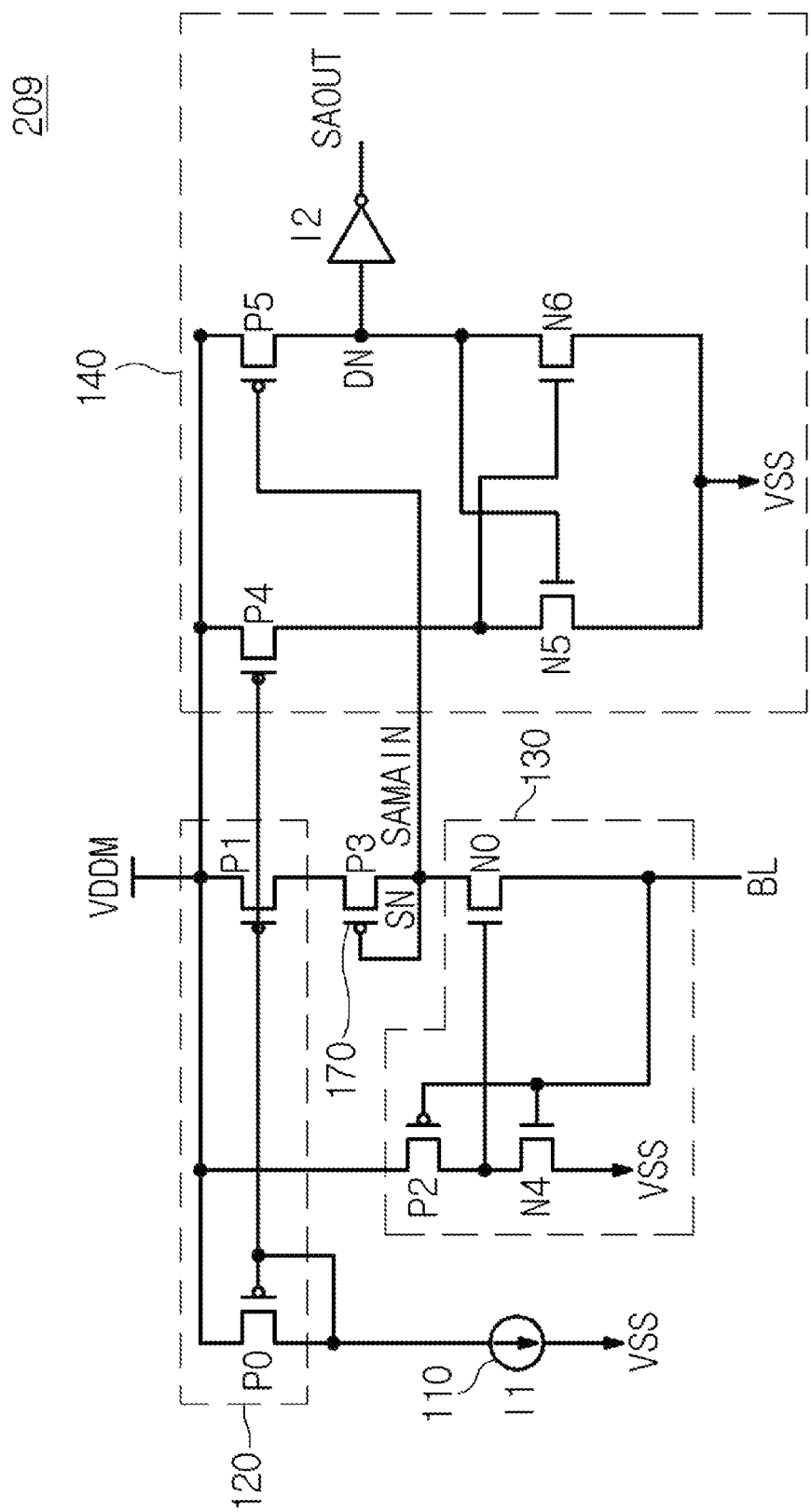
FIGS. 2 and 3 illustrate a semiconductor device according to one or more embodiments of the present disclosure.

FIG. 2 illustrates a sense amplifier according to one or more embodiments of the present disclosure.

Referring to FIG. 2, the sense amplifier 209 may comprise a current source circuit 110, a current mirror circuit 120, a bit line regulator circuit 130, a sense amplifier output circuit 140, and an active load 170. In the present disclosure, the sense amplifier 209 is related to a read operation for determining whether data of the memory cell is "0" or "1". Herein, the "0" and "1" may mean an erased state and a programmed state, respectively. The active load 170 may comprise a MOS type diode or MOS diode. For example, MOS type diode may comprise an P-channel metal oxide semiconductor (PMOS) type diode or N-channel metal oxide semiconductor (NMOS) type diode. A gate terminal and a drain terminal are tied together in the PMOS or NMOS transistor to be used as a diode. In many CMOS technologies, it is difficult to fabricate resistors with tightly-controlled values or a reasonable physical size. Consequently, it is desirable to replace such resistance with a MOS transistor. A MOSFET can operate as a small-signal resistor if its gate and drain are shorted. The active load 170, for example, an active resistor, can be used in place of polysilicon or diffused resistor to produce a DC voltage drop and/or provide small signal resistance that is linear over a small range. So the active load 170 may reduce a peak-to-peak voltage or peak amplitude of voltage or pulse height of voltage for a high-speed read operation.

The current source circuit 110 may generate and supply a reference current desired to determine "0" or "1" in accordance with a value of the current flowing through the memory cell. For example, the current source circuit 110 may generate the reference current by a constant current power supply I1.

The current mirror circuit 120 mirrors the reference current generated by the current source circuit 110 and can generate a reference current of a sense amplifier 209. According to one embodiment, the current mirror circuit 120 may comprise a first P-type MOS field effect transistor (PMOS transistor) P0 and a second PMOS transistor P1. A drain and a gate of the first PMOS transistor P0 may be connected to the constant current power supply I1, and a source of the first PMOS transistor P0 may be connected to a first power supply VDDM. The first power supply VDDM may be a high voltage (e.g., 5 V or 3.3 V). The first power supply VDDM may be an operating voltage or an operating power supply. A source of the second PMOS transistor P1 may also be connected to the first power supply VDDM, a gate of the second PMOS transistor P1 may be connected to the gate of the first PMOS transistor P0, and a drain of the second PMOS transistor P1 may be connected to the active load 170. Since current flowing through the gate of the first PMOS transistor P0 and current flowing through the gate of the second PMOS transistor P1 are the same as each other, current flowing through the drain of the first PMOS transistor P0 and current flowing through the drain of the second PMOS transistor P1 can also be the same as each other. Accordingly, the current flowing through the drain of the second PMOS transistor P1 may be the same as the reference current provided by the constant current power supply I1.

The bit line regulator circuit 130 can maintain a read current to be constant even when the value of the first power supply VDDM is changed during the read operation.

According to one embodiment, the bit line regulator circuit 130 may comprise a third PMOS transistor P2, a first NMOS transistor N0, and a fifth NMOS transistor N4. A source of the third PMOS transistor P2 may be connected to the first power supply. A drain of the third PMOS transistor P2 may be connected to a drain of the fifth NMOS transistor N4 and a gate of the first NMOS transistor N0. A gate of the third PMOS transistor P2 together with a gate of the fifth NMOS transistor N4 and a source of the first NMOS transistor N0 may be connected to a selected bit line BL. A source of the fifth NMOS transistor N4 may be connected to a second power supply VSS. A drain of the first NMOS transistor N0 may be connected to the active load 170. Here, the second power supply VSS may be a low voltage (e.g., 0 V), a ground voltage, or a ground. A voltage at a sense node SN becomes a sense amplifier input voltage SAMAIN supplied to the sense amplifier output circuit 140.

The sense amplifier output circuit 140 can determine whether the value stored in the memory cell is "0" ("L") or "1" ("H") based on the sense amplifier input voltage SAMAIN. According to one embodiment, the sense amplifier output circuit 140 may comprise a fifth PMOS transistor P4, a sixth PMOS transistor P5, a sixth NMOS transistor N5, a seventh NMOS transistor N6, and an inverter I2.

A source of the fifth PMOS transistor P4 may be connected to the first power supply VDDM. A gate of the fifth PMOS transistor P4 may be connected to the gates of the first PMOS transistor P0 and the second PMOS transistor P1, and to the constant current power supply I1. A drain of the fifth PMOS transistor P4 may be connected to a drain of the sixth NMOS transistor N5 and a gate of the seventh NMOS transistor N6. A source of the sixth PMOS transistor P5 may be connected to the first power supply VDDM. A gate of the sixth PMOS transistor P5 may be connected to the gate and the drain of the fourth PMOS transistor P3, and may also be connected to the active load 170, to which the drain of the first NMOS transistor N0 is connected. A drain of the sixth PMOS transistor P5 is connected to a gate of the sixth NMOS transistor N5 and a drain of the seventh NMOS transistor N6. A source of the sixth NMOS transistor N5 and a source of the seventh NMOS transistor N6 may be connected to the second power supply VSS. A voltage at the drain of the sixth PMOS transistor P5 is output through the inverter I2, and the sense amplifier output voltage SAOUT which is output signal of the inverter I2 may be a result obtained by determining whether the value of the memory cell is "1" ("H") or "0" ("L").

The active load 170 may comprise an PMOS diode or NMOS diode. For example, a fourth PMOS transistor P3 may be implemented for the PMOS diode or NMOS diode 170. A gate of the PMOS transistor P3 is connected to a drain of the PMOS transistor P3. A source of the PMOS transistor P3 is connected to a drain of the second PMOS transistor P1.

The active load 170 may be connected to a second PMOS transistor P1 in the current mirror circuit 120 and a first NMOS transistor N0 in the bit line regulator circuit 130. The PMOS diode or NMOS diode 170 is capable of lowering the input voltage SAMAIN in order to perform a high speed read operation. That is, the level of the input voltage SAMAIN may be lowered through the active load 170 for a high-speed read operation. As discussed above, a source of the fourth PMOS transistor P3 may be connected to a drain of the second PMOS transistor P1. A gate of the fourth PMOS transistor P3 is electrically connected to a drain of the fourth PMOS transistor P3. The active load 170 is connected to a drain of the first NMOS transistor N0.

Figure 3:
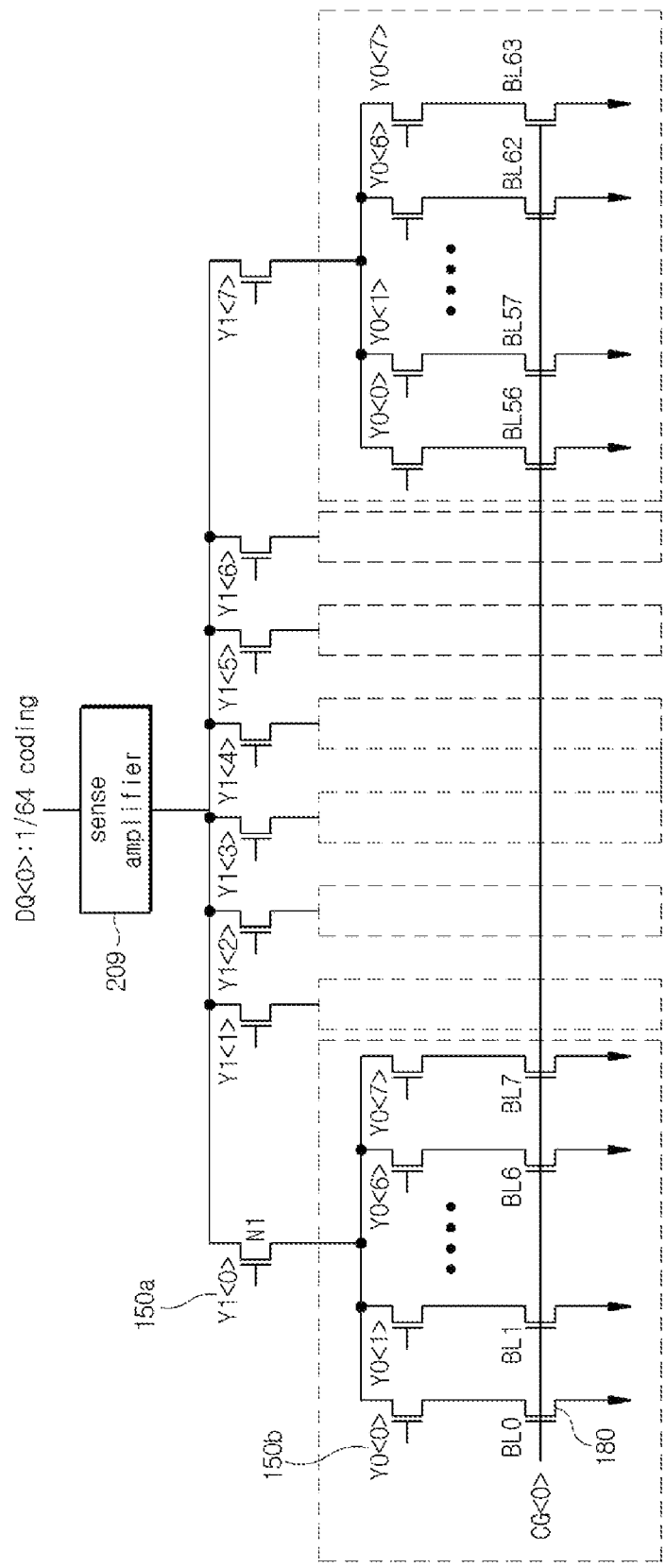

FIG. 3 illustrates semiconductor device including a bit line selection circuit according to one or more embodiments of the present disclosure.

Referring to FIG. 3, a semiconductor device may comprise a bit line selection circuit 150, a memory cell 180 and a sense amplifier 209. The bit line selection circuit 150 is disposed between the sense amplifier 209 and the memory cell 180. The bit line selection circuit 150 serves to transfer a reference current from the sense amplifier 209 to the selected memory cell 180 through the selected bit line BL during the read operation. For rapid read operations, it is beneficial that a drain voltage (bit line voltage) of the memory cell be increased up to a read voltage level by rapidly transferring the reference current to a drain terminal of the memory cell 180.

The bit line selection circuit 150 may comprise two groups of select transistors. A first group may comprise main select transistors Y1<0> to Y1<7> in a first row. The Y1<0> to Y1<7> may be called as first to eighth main select transistors 150a.

A second group may comprise sub-select transistors Y0<0> to Y0<7> in a second row. The Y0<0> to Y0<7> may be called as sub-select transistors 150b. For example, 8 sub-select transistors are repeated with the main select transistors Y1<0> to Y1<7>. For example, each of the main select transistor Y1<0> to Y1<7> may have 8 sub-select transistors. For example, in a first column, the first main select transistor Y1<0> in the first row is connected to a plurality of the sub-select transistors Y0<0> to Y0<7> in the second row. In the same manner, in a second column, the seven main select transistor Y1<7> in the first row is connected to a plurality of the sub-select transistors Y0<0> to Y0<7> in the second row. For example, the bit line selection circuit 150 may comprise 8 main select transistors, 64 sub-select transistors and 64 bit lines. Each column may comprise 1 main select transistor and 8 sub-select transistors.

In the first column, each of the sub-select transistors Y0<0> to Y0<7> is respectively connected to bit lines BL0 to BL7. Consequently, the sub-select transistor is one-by-one connected to the bit line. Further, in the first column, each of bit lines BL0 to BL7 is respectively connected to each of memory cells 180. The bit line is one-by-one connected to the memory cell. Specifically, each of the bit lines BL0 to BL7 may be connected to a drain node of the memory cell. A source node of the memory cell 180 may be connected to a ground voltage or a source switch transistor. For example, the memory cell array 207 may comprise 64 memory cells 180 in a same row. CG<0> means a first control gate line or word line (WL). The first word line CG<0> is connected to all the 64 memory cells disposed in the same row.

Figure 4:
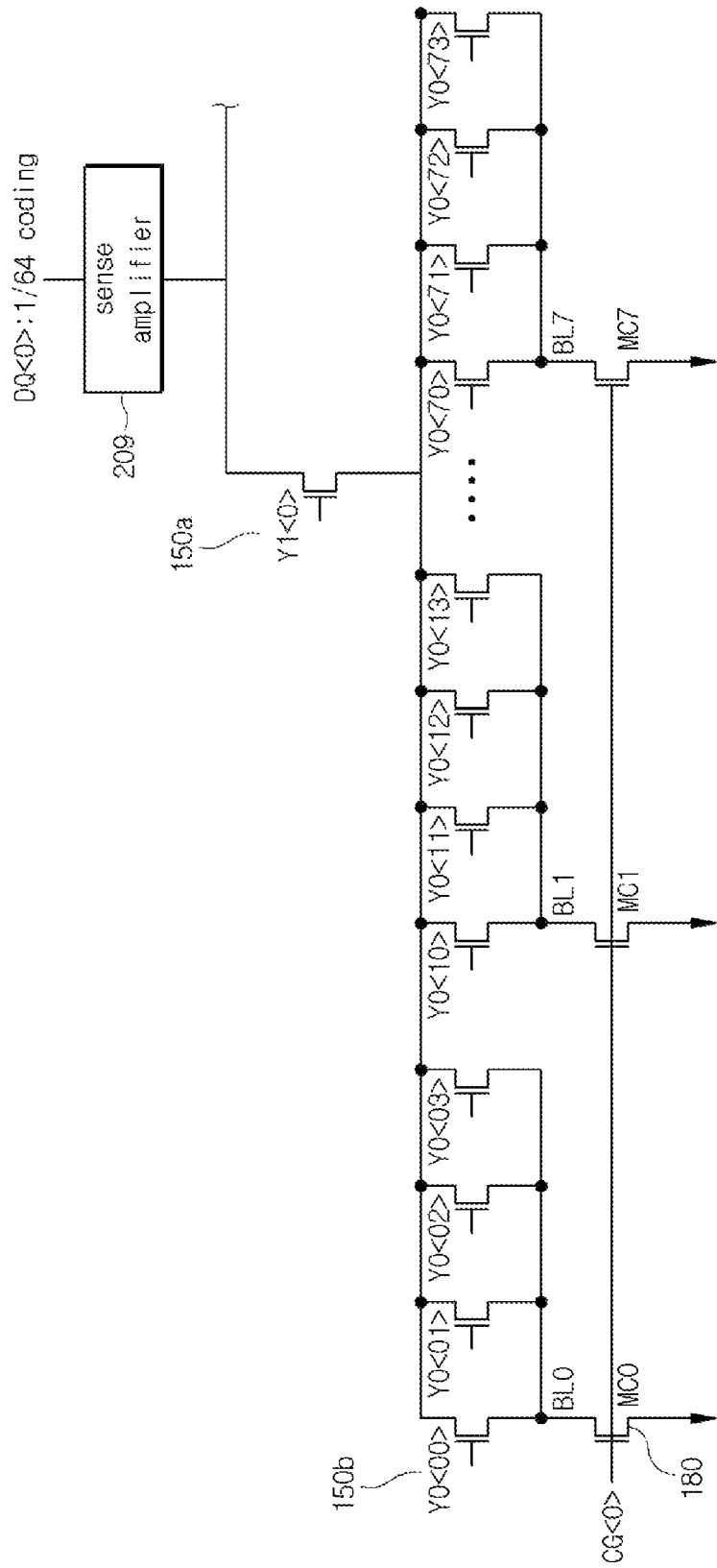
FIGS. 4 and 5 illustrate a bit line select transistors according to one or more embodiments of the present disclosure.

FIG. 4 illustrates another semiconductor device including a bit line selection circuit according to one or more embodiments of the present disclosure.

Referring to FIG. 4, another semiconductor device may comprise a bit line selection circuit 150, a memory cell 180 and a sense amplifier 209. The bit line selection circuit 150 is disposed between the sense amplifier 209 and the memory cell 180. As discussed in FIG. 3, the bit line selection circuit 150 serves to transfer a reference current from the sense amplifier 209 to the selected memory cell 180 through the selected bit line BL during the read operation. For rapid read operation, it is beneficial that a drain voltage of the memory cell 180 is increased up to a read voltage level by rapidly transferring the reference current to a drain node of the memory cell 180.

The bit line selection circuit 150 in the semiconductor device in FIG. 4 may comprise first and second groups of select transistors. The first group of select transistors are the same as the first group of the select transistor in FIG. 3. For example, the first group may comprise main select transistors Y1<0> to Y1<7> in a first row. The Y1<0> to Y1<7> may be called as first to eighth main select transistors 150*a*.

On the other hand, the second group may comprise sub-select transistors Y0<00> to Y0<73> in a second row. The Y0<00> to Y0<73> may be called as sub-select transistors 150*b*. For example, in the second group, a plurality of first sub-select transistors Y0<00>, Y0<01>, Y0<02> and Y0<03> are provided instead of the sub-select transistor Y<0> of FIG. 3. The plurality of first sub-select transistors Y0<00>, Y0<01>, Y0<02> and Y0<03> are connected to first bit line BL0. For example, in a first column, first four sub-select transistors Y0<00>, Y0<01>, Y0<02> and Y0<03> are connected to a first bit line BL0. In the same manner, second four sub-select transistors Y0<10>, Y0<11>, Y0<12> and Y0<13> are connected to a second bit line BL1. Further, eighth four sub-select transistors Y0<70>, Y0<71>, Y0<72> and Y0<73> are connected to an eighth bit line BL7. For example, first column may have one main select transistor Y1<0>, 8 bit lines BL0 to BL7, 8 memory cells MC0 to MC7, 4 sub-select transistors per one bit line. Consequently, there are 8 bit lines, 8 memory cells and 32 (=4 sub-select transistors*8 bit lines) sub-select transistors per one main select transistor.

One bit line BL may be connected to at least four sub-select transistors Y0<x0>, Y0<x1>, Y0<x2> and Y0<x3>, wherein x is one of 0 to 7 which is determined based on the connected one bit line BL. On the other hand, each of bit lines BL0 to BL7 is respectively connected to each of memory cells 180. The bit line is one-by-one connected to the memory cell.

Each gate of the plurality of bit line sub-select transistors Y0<00>, Y0<01>, Y0<02> and Y0<03> is separated each other and respectively received each gate control signals. The drain voltage of the memory cell may be rapidly increased up to sufficient level by arranging four sub-select transistors Y0<00>, Y0<01>, Y0<02> and Y0<03>. It is preferable that the bit line selection circuit 150 should increase the number of sub-select transistors in order to quickly transfer a bit line voltage (drain voltage) to the memory cell 180. In addition, it is preferable that the bit line selection circuit 150 should separate the gate control signals of the sub-select transistors respectively for the purpose of a high-speed read operation. Here, the sub-select transistors Y0<00>, Y0<01>, Y0<02> and Y0<03> are connected in parallel to open at the same time or close at the same time, and thus, the sub-select transistors allow read current to be supplied to the memory cell 180 through the bit line BL at the same time, so that the read operation can be performed faster.

Further, each of the bit lines BL0 to BL7 may be connected to a drain node of the memory cell 180. A source node of the memory cell 180 may be connected to a ground voltage or a source switch N3, 160. For example, the memory cell array 207 may have 64 memory cells 180 in a same row. CG<0> means a first control gate line or word line (WL). The first word line CG<0> is connected to all the 64 memory cells disposed in the same row.

A plurality of second sub-select transistors Y0<10>, Y0<11>, Y0<12> and Y0<13> are connected to the first main select transistor Y1<0>, wherein the plurality of second sub-select transistors Y0<10>, Y0<11>, Y0<12> and Y0<13> are connected to a second bit line BL1, and the second bit line is connected to a second memory cell. Each of the first to eighth main NMOS select transistors Y1<0> to Y1<7> comprises another sub-NMOS select transistors. The other sub-NMOS select transistors are correspondingly connected to another bit lines, and wherein each of the memory cells is electrically connected to the other sub-NMOS select transistors.

Figure 5:
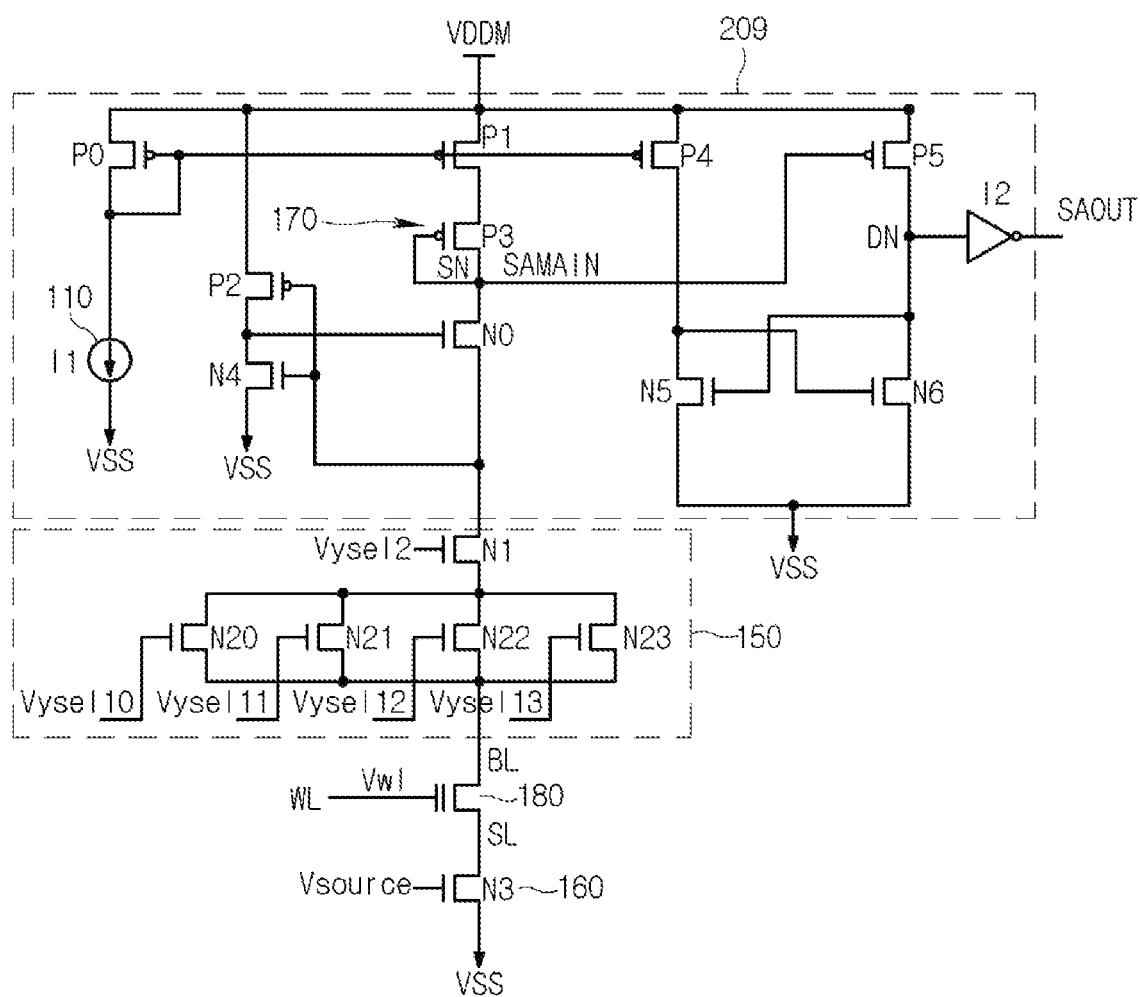

FIG. 5 illustrates a semiconductor device according to one or more embodiments of the present disclosure.

Referring to FIG. 5, the semiconductor device may comprise a sense amplifier 209, a bit line selection circuit 150, a memory cell 180 and source switch 160. Since the sense amplifier 209 is discussed above, the detailed explanation is omitted. The bit line selection circuit 150 may be disposed between the bit line BL and the active load 170 in the sense amplifier 209. The bit line selection circuit 150 comprises a plurality of NMOS transistors N20, N21, N22, and N23 connected in parallel to each other. The NMOS transistors N20, N21, N22, and N23 correspond to one of the first to eighth sub-select transistors Y0<00>, Y0<01>, Y0<02> and Y0<03> to Y0<70>, Y0<71>, Y0<72> and Y0<73> of FIG. 4. The bit line selection circuit 150 comprises a main NMOS transistor N1 which is corresponded to one of the main select transistors Y1<0> to Y1<7> of FIG. 3 or FIG. 4. FIG. 5 describes four sub-select transistors for one bit line BL, but it is not necessarily limited thereto. A smaller number of NMOS transistors or a greater number of NMOS transistors can be used.

Further, each gate of the plurality of sub-select transistors N20, N21, N22, and N23 is separated each other and each gate receives gate control signals Vysel10, Vysel11, Vysel12, and Vysel13, respectively. The drain voltage of the memory cell may be rapidly increased up to sufficient level by arranging four sub-select transistors N20, N21, N22, and N23. The rapid read operation is possible by arranging the sub-select transistors N20, N21, N22, and N23. It is preferable that the bit line selection circuit 150 should increase the number of sub-select transistors in order to quickly transfer a bit line voltage to the memory cell 180. In addition, it is preferable that the bit line selection circuit 150 should separate the gate control signals of the sub-select transistors for the purpose of a high-speed read operation. Here, the first sub-NMOS select transistor N20, the second sub-NMOS select transistor N21, the third sub-NMOS select transistor N22, and the fourth sub-NMOS select transistor N23 are connected in parallel to open at the same time or close at the same time, and thus, the four sub-NMOS select transistors allow read current to be supplied to the memory cell 180 through the bit line BL at the same time, so that the read operation can be performed faster.

The memory cell 180 may comprise a control gate CG, a floating gate, a drain terminal, and a source terminal. A word line WL is connected to the control gate CG. A bit line BL and a source line SL may be electrically connected to the drain terminal and the source terminal, respectively. The bit line BL is electrically connected to the bit line selection circuit 150. The source line SL is electrically connected to the source switch 160. The source switch 160 may comprise a fourth NMOS transistor N3. For programming the memory cell 180, i.e., "H (high)", a programming voltage Vwl may be applied to a gate of the selected memory cell 180.

When the memory cell is in erasing state and a memory gate voltage has become a sufficiently high, the memory cell 180 starts to draw a memory current form the bit line BL. Therefore, in the memory current drawing operation, the voltage of the bit line BL decrease. The first NMOS transistor N0 becomes an on-state and the voltage at the sense node SN becomes equal to the bit line BL. As a result, the voltage SAMAIN at the sense node SN decreases. A current corresponding to the memory current flows into the drain node DN. Consequently, the drain voltage at the drain node DN rises and the output signal of the invertor I2 becomes low' or '0'.

In detail, when the current of the selected memory cell 180 flows more than the reference current, the input voltage SAMAIN at the sense node SN decreases. When the input voltage SAMAIN at the sense node SN decreases, the voltage of a gate of the sixth PMOS transistor P5 of the sense amplifier output circuit 140 decreases, and the sixth PMOS transistor P5 is turned on. A drain voltage of the sixth PMOS transistor P5 rises close to the first power supply VDDM. Here, as the drain voltage of the sixth PMOS transistor P5 is applied to the gate of the sixth NMOS transistor N5, the sixth NMOS transistor N5 is turned on. A drain voltage of the sixth NMOS transistor N5 falls close to the second power supply VSS. Since the drain of the sixth NMOS transistor N5 is connected to the gate of the seventh NMOS transistor N6, the drain voltage of the seventh NMOS transistor N6 falls close to the second power supply VSS. Thus, the seventh NMOS transistor N6 is turned off to cause the drain voltage of the sixth PMOS transistor P5 to rise close to the first power supply VDDM more quickly.

On the other hand, when the memory cell is in a programming state, even the sufficient gate voltage is applied to the memory cell 180, the memory cell 180 is not easily turn-on. So the drawing of the memory current from the bit line BL by the memory cell 180 is not performed. The memory current is lower than the reference current. Therefore, the voltage of the bit line BL does not decrease. Hence no memory current flows into the sense node SN or the drain node DN. As a result, the voltage SAMAIN at the sense node SN increases. Consequently, the drain voltage at the drain node DN decreases, and the output signal of the invertor I2 becomes 'high' or '1'.

In detail, when the memory cell 180 is programmed, a sensing current of the selected memory cell 180 may be less than the reference current. The input voltage SAMAIN at the sense node SN may increase. The sixth PMOS transistor P5 in the sense amplifier output circuit 140 has a gate voltage, Vg higher than the reference voltage, Vref. Thus, the sixth PMOS transistor P5 becomes turned off, and then the drain voltage of the sixth PMOS transistor P5 falls. Since the drain of the sixth PMOS transistor P5 is connected to the gate of the sixth NMOS transistor N5, when the drain voltage of the sixth PMOS transistor P5 decreases, the sixth NMOS transistor N5 is also turned off, and the drain voltage of the sixth NMOS transistor N5 is increased. The drain of the sixth NMOS transistor N5 is connected to the gate of the seventh NMOS transistor N6. When the drain voltage of the sixth NMOS transistor N5 increases, a gate voltage of the seventh NMOS transistor N6 increases. Thus, the seventh NMOS transistor N6 is turned on and the source of the seventh NMOS transistor N6 connected to the second power supply VSS is connected to the drain, so that the drain voltage of the sixth PMOS transistor P5 connected to the drain of the seventh NMOS transistor N6 is decreased faster. The drain voltage of the sixth PMOS transistor P5 becomes the input of the inverter I2, and the output signal of the inverter I2 becomes "1" ("H"), so that the sense amplifier output voltage SAOUT becomes "1" ("H").

When the read operation is started, a constant reference current flows by the constant current power supply I1 in the current source circuit 110. In addition, the constant reference current may flow through the P1 and P3 in the active load 170 by the current mirror circuit 120.

Figure 6:
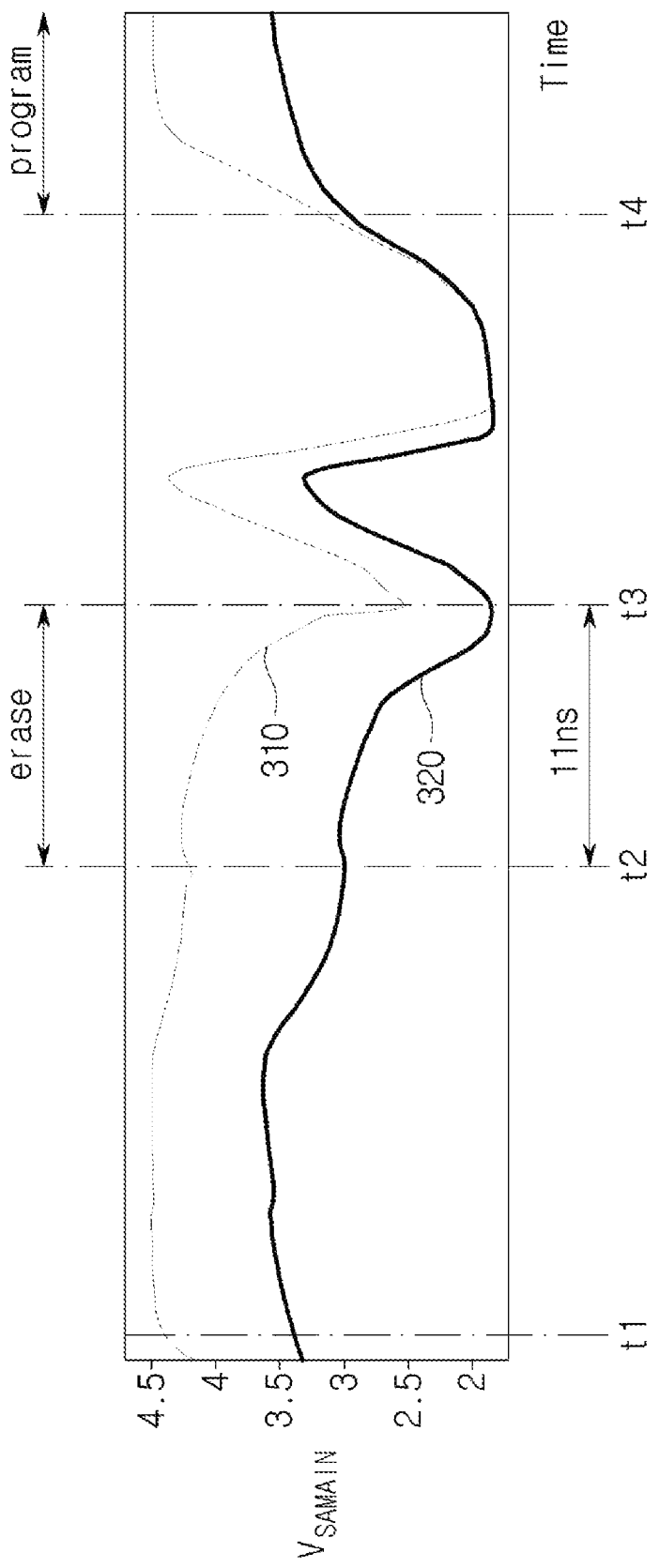
FIGS. 6 and 7 illustrate simulation results of a sense amplifier input voltage (SAMAIN) and a sense amplifier output signal (SAOUT), respectively, during a read operation, according to one or more embodiments of the present disclosure.
Figure 7:
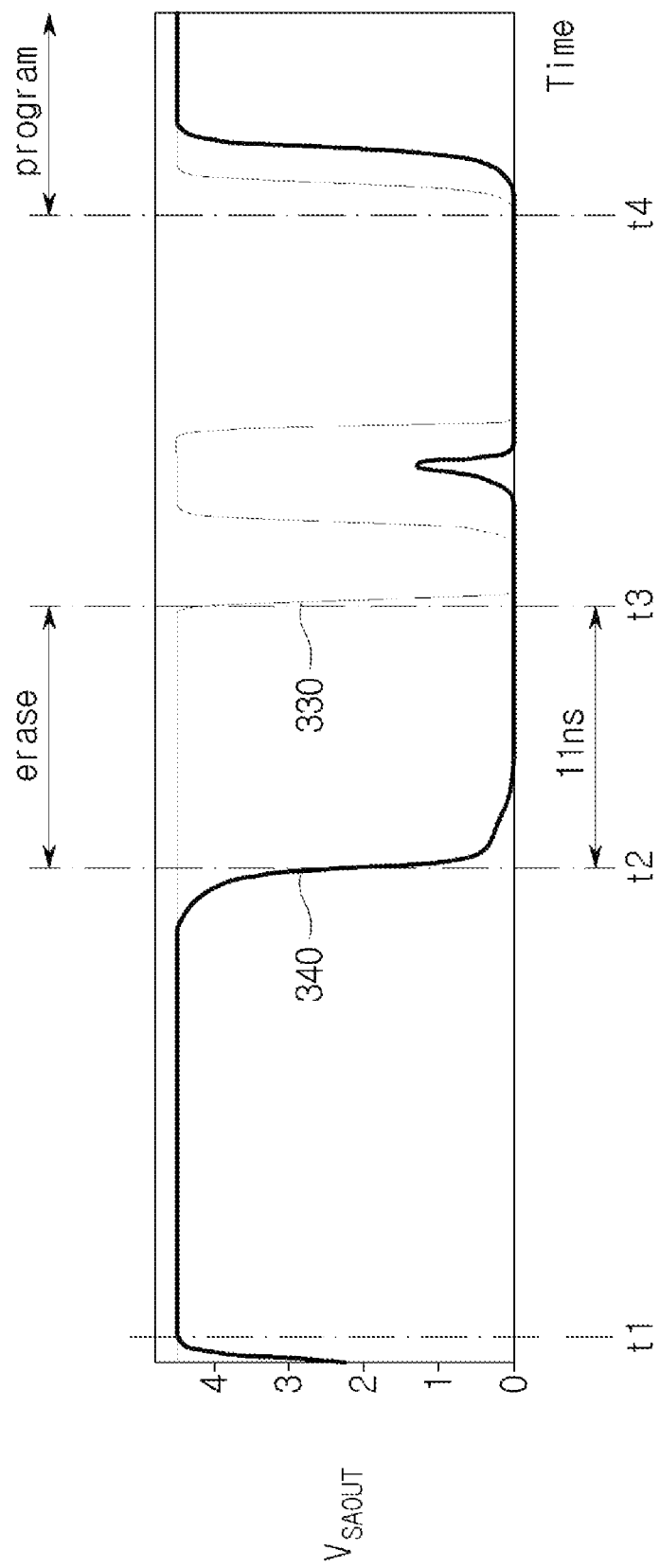

FIGS. 6 and 7 illustrate simulation results of a sense amplifier input voltage (SAMAIN) and a sense amplifier output voltage (SAOUT), respectively, during read operation, according to one or more embodiments of the present disclosure.

Referring to FIG. 6, SAMAIN 310 and SAMAIN 320 denote a variation of a sense amplifier input voltage (SAMAIN) with time. The SAMAIN 310 refers to the variation of a sense amplifier input voltage in the embedded memory without the PMOS diode or NMOS diode 170 (PM3). The SAMAIN 320 refers to the variation of a sense amplifier input voltage (SAMAIN) in the embedded memory with the PMOS diode or NMOS diode 170 (PM3). The SAMAIN 310 has a voltage level around 4.49 V; however, the SAMAIN 320 has a voltage level around 3.62V. The magnitude of the SAMAIN 320 is smaller than that of the SAMAIN 310. As mentioned above, this is because the PMOS diode or NMOS diode 170 may serve to decrease the magnitude of the SAMAIN for a high-speed read operation.

Referring to FIG. 7, SAOUT 330 and SAOUT 340 denote a variation of a sense amplifier output voltage (SAOUT) with time. The SAOUT 330 refers to the variation of a sense amplifier output voltage in the embedded memory without the PMOS diode or NMOS diode 170. The SAOUT 340 refers to the variation of a sense amplifier output voltage (SAOUT) in the embedded memory with the PMOS diode or NMOS diode 170. A first falling down curve around t2 means the read operation is performed to the erased memory cell. A first falling down curve for SAOUT 340 starts at t2, however, a first falling down curve for SAOUT 330 starts at t3. A difference between t2 and t3 is about 11 nsec. This is because while the upper limit of an operating range of the input voltage SAMAIN of the active load 170 is reduced from 4.49 V to 3.62 V by the addition of the PMOS diode or NMOS diode 170. Also, an effect may vary depending on the width of the fourth PMOS transistor P3 of the PMOS diode or NMOS diode 170. In other words, there is a result that when the size of the fourth PMOS transistor P3 is 2 um/0.5 μm, 1 um/0.5 um, 0.5 um/0.5 um, the output voltage SAOUT of the sense amplifier output circuit 140 becomes 3.9 ns, 5.5 ns, 11.2 ns. That is, it can be seen that the smaller the size of the fourth PMOS transistor P3 is, the higher the reading speed is.

Figure 8:
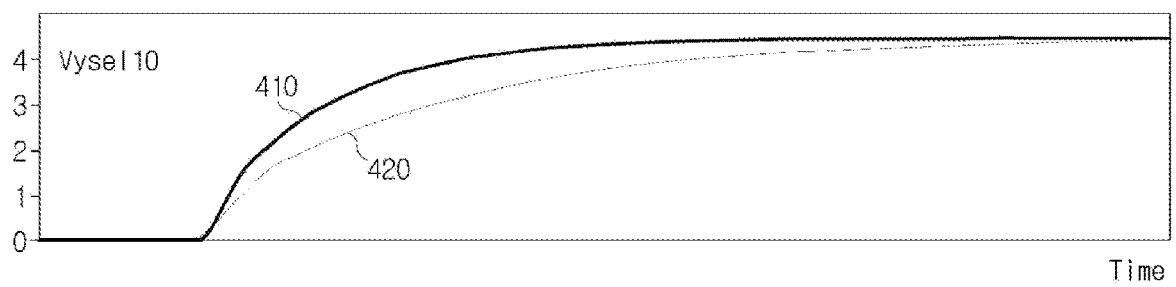
FIG. 8 to FIG. 10 illustrate simulation results, according to one or more embodiments of the present disclosure.
Figure 9:
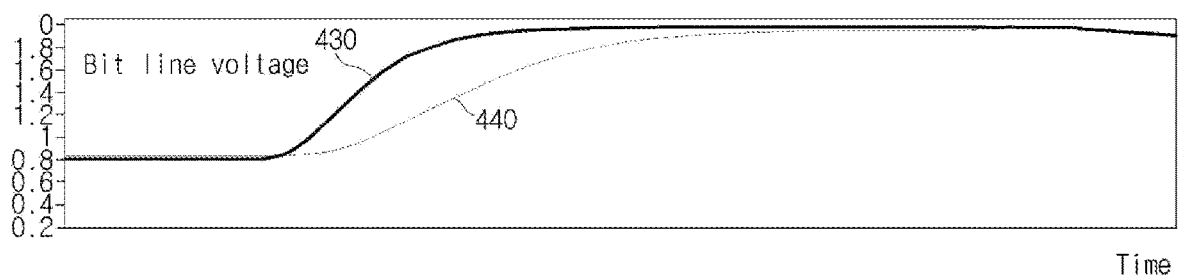
Figure 10:
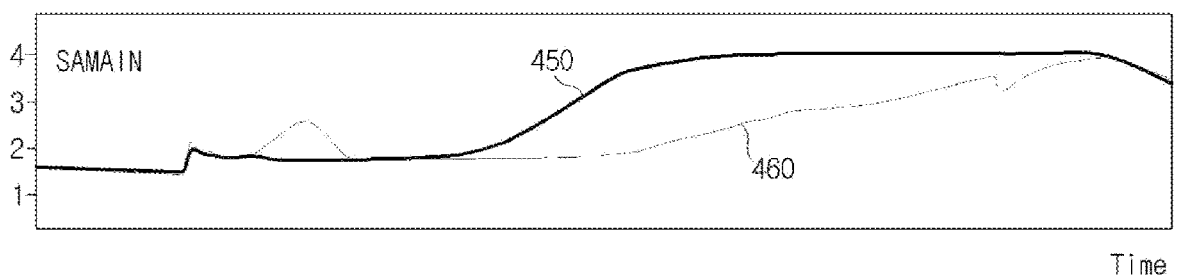

FIG. 8 to FIG. 10 illustrate simulation results, according to one or more embodiments of the present disclosure.

FIG. 8 illustrates a gate voltage versus time in a bit line sub-select transistor. A gate voltage 410 is more rapidly increased than a gate voltage 420, because, in the present disclosure, a plurality of bit line sub-select transistors are implemented to connect in parallel with each other. Each gate of the plurality of bit line sub-select transistors are separated to receive a separated gate control signal. As a number of bit line sub-select transistors is increased, a bit line pre-charge time is reduced. So the gate voltage 410 may quickly rise-up. So the access time (tAA) is improved.

Referring to FIG. 9, a bit line voltage 430 according to the technology proposed in the present disclosure rises more quickly than a bit line voltage 440 according to the conventional technology.

Referring to FIG. 10, a sense amplifier input voltage, SAMAIN 450, when the active load 170 exists, increases more quickly than an input voltage SAMAIN 460 when the active load 170 does not exist. Therefore, it can be seen that the high-speed read operation can be performed.

According to one or more embodiments of the present disclosure, it is possible to increase a reading speed in the embedded memory.

According to one or more embodiments of the present disclosure, it is possible to improve the operation speed of an entire chip by increasing the reading speed in the embedded memory.

Advantageous effects obtained from the present disclosure are not limited to the above-mentioned effects. Further, other unmentioned effects can be clearly understood from the following descriptions by those skilled in the art to which the present disclosure belongs.

Various embodiments and terms used therein are not intended to limit the features described in the present disclosure to specific embodiments, and should be construed as including various modifications, equivalents, or substitutions of the embodiments.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
   a memory cell array comprising memory cells;
   bit lines connected to the memory cells, wherein when a first memory cell of the memory cells and a first bit line of the bit lines are selected, a read current is supplied to the first memory cell through the first bit line to perform a read operation;
   a bit line selection circuit comprising a first main select transistor and a plurality of first sub-select transistors connected in parallel with each other,
   wherein each gate of the plurality of first sub-transistors is configured to receive a separated gate control signal, and the plurality of first sub-select transistors are configured to be the first memory cell through the first bit line to transfer the read current from the first bit line to the first memory cell; and
   a sense amplifier configured to compare a reference current having a predetermined current value with a memory current drawn by the first memory cell and output an output signal based on an input voltage,
   wherein the sense amplifier comprises an active load, the active load comprising a MOS transistor having a source terminal connected to an operating power supply through a first PMOS transistor and gate and drain terminals connected to the first main select transistor through a first NMOS transistor and configured to reduce the input voltage at a sense node.

2. The semiconductor device of claim 1, wherein the plurality of first sub-transistors are disposed between the first main select transistor and the bit line.

3. The semiconductor device of claim 1, wherein the bit line selection circuit further comprises a plurality of second sub-select transistors connected to the first main select transistor, and
   wherein the plurality of second sub-select transistors are connected to a second bit line, and the second bit line is connected to a second memory cell.

4. The semiconductor device of claim 1, wherein the sense amplifier further comprises:
   a current source circuit configured to generate the reference current;
   a current mirror circuit configured to mirror the reference current and supply the reference current to the active load;
   a bit line regulator circuit configured to maintain the read current and connected to the bit line selection circuit; and
   a sense amplifier output circuit connected to the sense node and configured to generate the output signal.

5. The semiconductor device of claim 4, wherein the current mirror circuit comprises:
   the first PMOS transistor; and
   a second PMOS transistor, and
   wherein sources of the first and second PMOS transistors are connected to the operating power supply, and gates of the first and second PMOS transistors are connected to a constant current power supply and a drain of the second PMOS transistor.

6. The semiconductor device of claim 4, wherein the bit line regulator circuit comprises:
   the first NMOS transistor;
   a third PMOS transistor; and
   a fifth NMOS transistor, and
   wherein gates of the third PMOS and fifth NMOS transistors are connected to the bit line, and drains of the third PMOS and fifth NMOS transistors are connected to a gate of the first NMOS transistor.

7. The semiconductor device of claim 4, wherein the sense amplifier output circuit comprises:
   a fifth PMOS transistor;
   a sixth PMOS transistor;
   a sixth NMOS transistor;
   a seventh NMOS transistor; and
   an inverter, and
   wherein sources of the fifth and sixth PMOS transistors are connected to the operating power supply, and
   wherein drains of the fifth and sixth PMOS transistors are connected to gates of the sixth and seventh NMOS transistors, respectively.

8. An embedded flash memory comprising the semiconductor device of claim 1.

9. A semiconductor device comprising:
   a sense amplifier comprising:
      a current source circuit configured to generate a reference current; and
      a current mirror circuit configured to mirror the reference current and supply the reference current to an active load; and
   a bit line selection circuit, configured to select a bit line connected to a memory cell to be read,
   wherein the bit line selection circuit comprises a plurality of bit line select transistors connected in parallel to each other and connected to the selected bit line,
   wherein the plurality of bit line select transistors supply a read current to the selected bit line, and gate electrodes of the plurality of bit line select transistors are configured to receive gate control signals, respectively, wherein the sense amplifier comprises a sense amplifier output circuit configured to determine whether a value stored in the memory cell is "L" (low) or "H" (high), and wherein the active load comprises a MOS transistor having a source terminal connected to an operating power supply through a first MOS transistor and gate and drain terminals connected to a main select transistor of the bit line selection circuit through a second MOS transistor and configured to reduce an input voltage at a sense node.

10. The semiconductor device of claim 9, further comprising:
a bit line regulator circuit configured to maintain a bit line voltage of the selected bit line and connect the selected bit line to the active load.

11. The semiconductor device of claim 10, wherein when a current provided by the memory cell is greater than the reference current, an output signal of the sense amplifier output circuit becomes "L" (low), and
when the current provided by the memory cell is less than the reference current, the output signal becomes "H" (high).

12. An embedded flash memory comprising the semiconductor device of claim 9.

13. An embedded flash memory, comprising:
a memory cell array comprising memory cells connected to bit lines configured to supply read current to the memory cells during a read operation;

a bit line selection circuit comprising main select transistors and sub-select transistors, wherein each of the main select transistors is connected to subsets of the sub-select transistors, each of the subsets of the sub-select transistors is connected to each other in parallel, and gates of the subsets of the sub-transistors are configured to receive gate control signals, respectively; and a sense amplifier configured to compare a reference current with memory currents drawn by the memory cells and output output signals based on an input voltage, wherein the sense amplifier comprises an active load, the active load comprising a MOS transistor having a source terminal connected to an operating power supply through a first MOS transistor and gate and drain terminals connected to one of the main select transistors through a second MOS transistor and configured to reduce the input voltage at a sense node, and wherein the bit line selection circuit is disposed between the bit lines and the active loads.

14. The embedded flash memory of claim 13, wherein when a memory current of the memory currents is greater than the reference current, the input voltage at the sense node decreases.

* * * * *